US012545991B2

(12) United States Patent
Takahashi et al.

(10) Patent No.: US 12,545,991 B2
(45) Date of Patent: Feb. 10, 2026

(54) COATED MEMBER

(71) Applicants: KOBE STEEL, LTD., Hyogo (JP); MOLDINO Tool Engineering, Ltd., Tokyo (JP)

(72) Inventors: Tetsuya Takahashi, Takasago (JP); Ryosuke Takei, Takasago (JP); Aya Hino, Kobe (JP); Tomoya Sasaki, Tokyo (JP)

(73) Assignees: KOBE STEEL, LTD., Hyogo (JP); MOLDINO Tool Engineering, Ltd., Tokyo (JP)

( * ) Notice: Subject to any disclaimer, the term of this patent is extended or adjusted under 35 U.S.C. 154(b) by 0 days.

(21) Appl. No.: 18/845,605

(22) PCT Filed: Mar. 8, 2023

(86) PCT No.: PCT/JP2023/008711
§ 371 (c)(1),
(2) Date: Sep. 10, 2024

(87) PCT Pub. No.: WO2023/181927
PCT Pub. Date: Sep. 28, 2023

(65) Prior Publication Data

US 2025/0197986 A1 Jun. 19, 2025

(30) Foreign Application Priority Data

Mar. 22, 2022 (JP) ................................ 2022-045832

(51) Int. Cl.

| | |
|---|---|
| ***C23C 14/06*** | (2006.01) |
| ***C23C 14/32*** | (2006.01) |
| *C22C 29/08* | (2006.01) |

(52) U.S. Cl.
CPC ...... *C23C 14/0641* (2013.01); *C23C 14/0664* (2013.01); *C23C 14/325* (2013.01); *C22C 29/08* (2013.01)

(58) Field of Classification Search
CPC ........... C23C 14/0641; C23C 14/0664; C23C 14/325; C22C 29/08
See application file for complete search history.

(56) References Cited

U.S. PATENT DOCUMENTS

2002/0168552 A1* 11/2002 Yamamoto .......... C23C 14/3414 427/248.1
2004/0237840 A1 12/2004 Yamamoto et al.
(Continued)

FOREIGN PATENT DOCUMENTS

JP 09300106 A * 11/1997
JP 2011-025405 A 2/2011
(Continued)

OTHER PUBLICATIONS

JP-09300106-A Translation (Year: 1997).*

*Primary Examiner* — James Lin
*Assistant Examiner* — Patrick S Ott
(74) *Attorney, Agent, or Firm* — Studebaker Brackett PLLC

(57) ABSTRACT

A coated member of the present invention includes a substrate and a hard coating film that is formed on the surface of the substrate and includes a nitride or carbonitride of a metal element. A content of Al is 65 atom % or more and 85 atom % or less, a content of Cr is 15 atom % or more and 35 atom % or less, and a total content of Al and Cr is 90 atom % or more and 100 atom % or less in a total amount of the metal element and metalloid element contained in the hard coating film, and in an intensity profile obtained from a selected area diffraction pattern of a transmission electron microscope, a crystal plane exhibiting a maximum peak
(Continued)

intensity is different between a vicinity of the substrate and a vicinity of the surface, in the vicinity of the substrate, a peak corresponding to a (111) plane or a (200) plane of a face-centered cubic lattice structure exhibits a maximum intensity, and in the vicinity of the surface, a peak intensity corresponding to a (220) plane is 0.6 times or more a larger one of a peak intensity corresponding to the (200) plane and a peak intensity corresponding to the (111) plane of the face-centered cubic lattice structure.

3 Claims, 12 Drawing Sheets

(56) References Cited

U.S. PATENT DOCUMENTS

| | | | |
|---|---|---|---|
| 2005/0186448 A1 | 8/2005 | Yamamoto et al. | |
| 2008/0229891 A1* | 9/2008 | Lechthaler | C23C 14/0641 83/13 |
| 2010/0215912 A1 | 8/2010 | Kubota et al. | |
| 2011/0058909 A1* | 3/2011 | Matsuzawa | B23B 51/00 407/119 |
| 2020/0080187 A1 | 3/2020 | Katagiri | |

FOREIGN PATENT DOCUMENTS

| | | |
|---|---|---|
| JP | 2016-032861 A | 3/2016 |
| JP | 2018-051714 A | 4/2018 |
| JP | 2018-059146 A | 4/2018 |
| JP | 2020-040175 A | 3/2020 |
| WO | 2009/047867 A1 | 4/2009 |

* cited by examiner

100nm

COATED MEMBER

TECHNICAL FIELD

The present invention relates to a coated member applied to a mold or a cutting tool or the like.

BACKGROUND ART

AlCr nitride is a film type excellent in wear resistance and heat resistance, and is widely applied as a coating film for a coated member such as a mold or a cutting tool. In recent years, a coated member coated with Al-rich AlCr nitride in which an Al content ratio in a metal component exceeds 70 atom % by applying an arc ion plating method has been proposed (see Patent Literatures 1 to 3).

CITATION LIST

Patent Literature

Patent Literature 1: JP 2016-032861 A
Patent Literature 2: JP 2018-059146 A
Patent Literature 3: JP 2020-040175 A

SUMMARY OF INVENTION

An object of the present invention is to provide a coated member including a coating film containing Al-rich AlCr nitride and being excellent in durability.

As a result of intensive studies to solve the above problems, the present inventors have accomplished the present invention.

That is, a coated member according to the present invention is a coated member comprising: a substrate and a hard coating film formed on a surface of the substrate, wherein

- the hard coating film contains a nitride or carbonitride of a metal element;
- a content of aluminum (Al) is 65 atom % or more and 85 atom % or less, a content of chromium (Cr) is 15 atom % or more and 35 atom % or less, and a total content of aluminum (Al) and chromium (Cr) is 90 atom % or more and 100 atom % or less in a total amount of the metal element and metalloid element contained in the hard coating film;
- in the hard coating film, in an intensity profile obtained from a selected area diffraction pattern of a transmission electron microscope, a crystal plane exhibiting a maximum peak intensity is different between a vicinity of the substrate and a vicinity of the surface;
- in the vicinity of the substrate, a peak corresponding to a (111) plane or a (200) plane of a face-centered cubic lattice structure exhibits a maximum intensity; and
- in the vicinity of the surface, a peak corresponding to a crystal plane of the face-centered cubic lattice structure exhibits a maximum intensity and a peak intensity corresponding to a (220) plane of the face-centered cubic lattice structure is 0.6 times or more a larger one of a peak intensity corresponding to the (200) plane and a peak intensity corresponding to the (111) plane of the face-centered cubic lattice structure.

DESCRIPTION OF EMBODIMENTS

Figure 1:
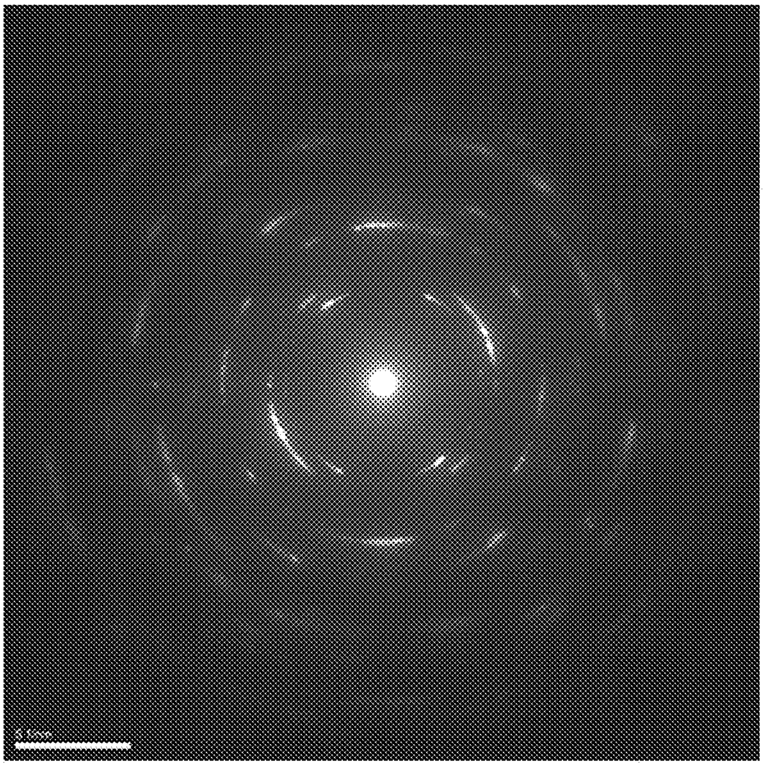
FIG. 1 is a diagram illustrating an example of a selected area diffraction pattern in the vicinity of a substrate of a hard coating film according to Example 1.

The present inventors have confirmed that there is room for improvement in durability of a conventional coated member provided with a coating film containing Al-rich AlCr nitride in cutting processing of high hardness steel.

The present inventors have found that the durability of a coated member in which a surface of a substrate is coated with a hard coating film containing an Al-rich nitride or carbonitride of Al and Cr is improved by controlling a crystal structure in the vicinity of the substrate and in the vicinity of a surface of the hard coating film. That is, according to the coated member in an embodiment of the present invention, the coated member excellent in durability can be obtained. Hereinafter, the embodiment of the present invention will be described in detail.

The coated member of the present embodiment is a coated member including a substrate and a hard coating film formed on the surface of the substrate and containing a nitride or carbonitride of a metal element. In the total amount of the metal element and metalloid element contained in the hard coating film, the content of aluminum (Al) is 65 atom % or more and 85 atom % or less, the content of chromium (Cr) is 15 atom % or more and 35 atom % or less, and the total content of aluminum (Al) and chromium (Cr) is 90 atom % or more and 100 atom % or less. In the hard coating film, in an intensity profile obtained from a selected area diffraction pattern of a transmission electron microscope, a crystal plane exhibiting a maximum peak intensity is different between the vicinity of the substrate and the vicinity of the surface. In the vicinity of the substrate, a peak corresponding to a (111) plane or (200) plane of a face-centered cubic lattice structure exhibits a maximum intensity. In the vicinity of the surface, a peak corresponding to a crystal plane of the face-centered cubic lattice structure exhibits a maximum intensity and a peak intensity corresponding to a (220) plane of the face-centered cubic lattice structure is 0.6 times or more a larger one of the peak intensity corresponding to the (200) plane and the peak intensity corresponding to the (111) plane of the face-centered cubic lattice structure. The coated member of the present embodiment can be applied to a mold or a cutting tool.

<Substrate>

In the present embodiment, the substrate is not particularly limited. As the substrate, cold tool steel, hot tool steel, high-speed steel, or cemented carbide or the like may be appropriately applied according to the application. The substrate may be subjected to nitriding treatment or metal bombardment treatment or the like in advance. The substrate may be mirror-finished by lapping or the like.

<Hard Coating Film>

(Aluminum (Al), Chromium (Cr))

The hard coating film according to the present embodiment contains a nitride or carbonitride of a metal element, and has an aluminum (Al) content of 65 atom % or more and 85 atom % or less, a chromium (Cr) content of 15 atom % or more and 35 atom % or less, and a total content of aluminum (Al) and chromium (Cr) of 90 atom % or more and 100 atom % or less in the total amount of the metal element and metalloid element (hereinafter, the "metal element and metalloid element" are also collectively and simply referred to as "metal element") contained in the hard coating film.

A nitride or carbonitride mainly composed of Al and Cr is a film type having excellent balance between wear resistance and heat resistance, and also has excellent adhesion to the substrate. In particular, the heat resistance of the hard coating film is improved by increasing the content ratio of Al in the nitride or the carbonitride. By increasing the Al content ratio, an oxide protective coating film is easily formed on the surface of the hard coating film, and the structure of the coating film becomes fine. As a result, the wear of the hard coating film due to adhesion is easily suppressed.

In the hard coating film according to the present embodiment, the Al content in the total amount of metal elements is 65 atom % or more. In other words, when the entire amount of the metal elements contained in the hard coating film is 100 atom %, the content ratio of Al is 65 atom % or more. As a result, the above-described effect of adding Al can be sufficiently exhibited. Preferably, the content ratio of Al is 68 atom % or more. Meanwhile, when the content ratio of Al becomes too large, AlN having a hexagonal close-packed (hcp) structure excessively increases, and the toughness of the hard coating film remarkably decreases. Therefore, in the hard coating film according to the present embodiment, the Al content in the total amount of metal elements is 85 atom % or less. In other words, when the entire amount of the metal elements contained in the hard coating film is 100 atom %, the content ratio of Al is 85 atom % or less. Preferably, the content ratio of Al is 82 atom % or less.

In the hard coating film according to the present embodiment, the Cr content in the total amount of metal elements is 15 atom % or more. In other words, when the entire amount of the metal elements contained in the hard coating film is 100 atom %, the content ratio of Cr is 15 atom % or more. As a result, a uniform and dense oxide protective coating film is easily formed on the surface of the hard coating film of the coated member during use of a mold using the coated member or processing by a cutting tool, and damage to the hard coating film is easily suppressed. Preferably, the content ratio of Cr is 18 atom % or more. Meanwhile, when the content ratio of Cr contained in the hard coating film is too large, it is difficult to obtain the effect of increasing the content ratio of Al described above. Therefore, in the hard coating film according to the present embodiment, the Cr content in the total amount of metal elements is 35 atom % or less. In other words, when the entire amount of the metal elements contained in the hard coating film is 100 atom %, the content ratio of Cr is 35 atom % or less. Preferably, the content ratio of Cr is 32 atom % or less.

In the hard coating film according to the present embodiment, the total content of Al and Cr in the total amount of metal elements is 90 atom % or more and 100 atom % or less. In other words, when the entire amount of the metal elements contained in the hard coating film is 100 atom %, the total amount of Al and Cr is 90 atom % or more and 100 atom % or less. Accordingly, the durability of the coated member is excellent. Preferably, the total amount of Al and Cr is 95 atom % or more.

The hard coating film according to the present embodiment contains a nitride or carbonitride of the above-described metal element. The hard coating film according to the present embodiment preferably contains a nitride from the viewpoint of being a film type more excellent in heat resistance among the nitride or the carbonitride.

The content ratio of the metal element in the hard coating film according to the present embodiment can be measured by using an electron probe microanalyzer (EPMA) for the mirror-finished hard coating film. In this case, for example, after the surface of the hard coating film is mirror-finished, the range of a diameter of about 1 μm in the surface of the hard coating film is set as an analysis region, and the content ratios of respective elements can be determined from the average of the contents of the elements in five analysis regions.

(Metal Element Other Than Aluminum (Al) and Chromium (Cr))

The hard coating film according to the present embodiment may contain a metal element other than Al and Cr. For example, the hard coating film according to the present embodiment can also contain one or more metal elements selected from elements of Group 4a, Group 5a, and Group 6a of the periodic table (Group 4, Group 5, and Group 6 in the long periodic table), and Si, B, Y, Yb, and Cu for the purpose of improving characteristics (hereinafter, also referred to as "coating film characteristics") such as wear resistance, heat resistance, and durability. Among these elements, Si and B are examples of metalloid elements. These elements are generally contained in the coating film for the coated member in order to improve the coating film characteristics of the coated member. The metal element other than Al and Cr may be contained within a range that does not significantly lower the durability of the coated member. However, when the content ratio of the metal element other than Al and Cr is too large, the durability of the coated member may be deteriorated. Therefore, when the hard coating film according to the present embodiment contains the metal element other than Al and Cr, the total content ratio thereof is preferably 10 atom % or less when the entire amount of the metal elements contained in the hard coating film is 100 atom %.

(Crystal Structure)

In the evaluation of the crystal structure of the hard coating film according to the present embodiment, an intensity profile obtained from a selected area diffraction pattern of a transmission electron microscope is used. This intensity profile can be obtained from a selected area diffraction pattern obtained using the transmission electron microscope for a processed cross section of the hard coating film. Specifically, the brightness of the selected area diffraction pattern of the hard coating film is converted into an intensity, and an intensity profile is produced with a horizontal axis as a distance (radius r) from a (000) plane spot center and a vertical axis as integrated intensity (arbitrary unit) for one round of a circle at each radius r. The crystal structure of the hard coating film is evaluated using the intensity profile obtained from the selected area diffraction pattern in this manner. In the present embodiment, the crystal structure of the hard coating film is evaluated using the intensity profile produced by removing the background intensity.

In the hard coating film according to the present embodiment, in the intensity profile obtained from the selected area diffraction pattern of the transmission electron microscope, a crystal plane exhibiting a maximum peak intensity is different between the vicinity of the substrate and the vicinity of the surface. This means that the crystal structure and/or the crystal grain size of the hard coating film changes from the vicinity of the substrate toward the vicinity of the surface. This makes it possible to enhance the wear resistance of the hard coating film in the vicinity of the surface while ensuring the adhesion between the substrate and the hard coating film. In the present description, the vicinity of the substrate of the hard coating film means that the range of the hard coating film is within 0.5 μm in a film thickness direction from the interface between the substrate of the hard coating film and the hard coating film. In the present description, the vicinity of the surface of the hard coating film means the depth range of the hard coating film is within 0.5 μm from the surface of the hard coating film.

In the vicinity of the substrate of the hard coating film according to the present embodiment, in the intensity profile obtained from the selected area diffraction pattern of the transmission electron microscope, a peak corresponding to a (200) plane or (111) plane of a face-centered cubic lattice structure exhibits a maximum intensity. Accordingly, the adhesion between the substrate and the hard coating film can be enhanced.

In the vicinity of the surface of the hard coating film according to the present embodiment, the peak intensity corresponding to the crystal plane of the face-centered cubic lattice structure exhibits the maximum intensity. The crystal plane of the face-centered cubic lattice structure is selected from a (200) plane, a (111) plane, and a (220) plane. When at least one of these crystal planes exhibits the maximum intensity, the durability of the hard coating film is enhanced.

In the vicinity of the surface of the hard coating film according to the present embodiment, the peak intensity corresponding to the (220) plane of the face-centered cubic lattice structure is 0.6 times or more the larger one of the peak intensity corresponding to the (200) plane and the peak intensity corresponding to the (111) plane of the face-centered cubic lattice structure. Hereinafter, a "value obtained by dividing the peak intensity corresponding to the (220) plane of the face-centered cubic lattice structure in the vicinity of the surface of the hard coating film by the larger one of the peak intensity corresponding to the (200) plane and the peak intensity corresponding to the (111) plane of the face-centered cubic lattice structure" is also referred to as "peak magnification". It is considered that the wear resistance is improved when the peak magnification is 0.6 times or more. The peak magnification is preferably 0.8 times or more, and more preferably 1.1 times or more. The fact that the peak intensity is 1.1 times or more, that is, the fact that the peak intensity of the (220) plane in the vicinity of the surface of the hard coating film is relatively larger than the peak intensity of other plane is considered to further improve the wear resistance, which is preferable. The upper limit of the peak magnification is not particularly specified, but the upper limit of the peak magnification is preferably 7. Furthermore, the upper limit of the peak magnification is preferably 5.

In the vicinity of the surface of the hard coating film according to the present embodiment, it is preferable that the peak intensity of the (220) plane of the face-centered cubic lattice structure is the maximum, and the peak intensity of the (111) plane of the face-centered cubic lattice structure is the next largest.

Since the hard coating film according to the present embodiment has a high Al content ratio, AlN having a hexagonal close-packed structure may be included in the microstructure. In the vicinity of the surface of the hard coating film according to the present embodiment, it is preferable that the AlN having the hexagonal close-packed structure contained in the microstructure is less. This is because sudden coating film breakage that occurs when the hard coating film is in contact with a workpiece is more easily suppressed as the AlN having the hexagonal close-packed structure contained in the microstructure is less in the vicinity of the surface on a side in contact with the workpiece.

The AlN having the hexagonal close-packed structure present in the microstructure of the hard coating film can be quantitatively determined by the following method. First, for the processed cross section (cross section in the film thickness direction) of the hard coating film, a selected area diffraction pattern is obtained using a transmission electron microscope, and an intensity profile obtained from the selected area diffraction pattern is produced. In the intensity profile of the selected area diffraction pattern of the transmission electron microscope, the relationship between Ih and If is evaluated on the basis of the value of $Ih\times100/(If+Ih)$.

In the evaluation of the relationship between Ih and If of the hard coating film according to the present embodiment, the background value of the intensity profile is removed. A measurement place is a cross section in the film thickness direction (a cross section in a direction orthogonal to the film thickness direction). Ih and If are defined as follows.

Ih: Maximum peak intensity corresponding to AlN having hexagonal close-packed structure.

If: Sum of peak intensities corresponding to (111), (200), and (220) planes of face-centered cubic lattice structure.

By evaluating the relationship between Ih and If on the basis of the above value of $Ih\times100/(If+Ih)$, the AlN having the hexagonal close-packed structure contained in the microstructure can be quantitatively evaluated. A smaller value of $Ih\times100/(If+Ih)$ means that AlN having a fragile hexagonal close-packed structure present in the microstructure is less. In the present embodiment, it is preferable that $Ih\times100/(If+$ Ih)≤20 is satisfied in the vicinity of the surface of the hard coating film. Furthermore, Ih×100/(If+Ih)≤15 is preferably satisfied.

<Intermediate Coating Film, Upper Layer>

In the coated member of the present embodiment, an intermediate coating film may be separately provided between the substrate and the hard coating film according to the present embodiment as necessary in order to further improve adhesion between the substrate and the hard coating film. The intermediate coating film may be, for example, a layer made of any of a metal, a nitride, a carbonitride, and a carbide.

A hard coating film (upper layer) having a component ratio or a composition different from that of the hard coating film according to the present embodiment may be separately formed on the hard coating film according to the present embodiment formed on the substrate. Furthermore, the hard coating film (first hard coating film) according to the present embodiment and another hard coating film (second hard coating film) having a component ratio or a composition different from that of the hard coating film (first hard coating film) according to the present embodiment may be laminated on each other. Specifically, the first hard coating film and the second hard coating film may be alternately laminated so as to form three or more layers.

The hard coating film according to the present embodiment preferably has a film thickness of 1 μm to 10 μm. When the intermediate coating film, the upper layer, and/or the second hard coating film are formed in addition to the hard coating film, the film thickness of each of the coating films is preferably 1 μm to 10 μm. When the thickness t of the hard coating film is less than 1 μm, in the present description, the vicinity of the substrate of the hard coating film means that the range of the hard coating film is within t/2 in the thickness direction from the interface between the substrate and the hard coating film. Similarly, when the thickness t of the hard coating film is less than 1 μm, in the present description, the vicinity of the surface of the hard coating film means that the range of the hard coating film is within a depth t/2 from the surface of the hard coating film.

<Method for Manufacturing Coated Member>

The coated member of the present embodiment can be produced by coating (forming) the surface of a substrate with a hard coating film. For example, an arc ion plating method is preferably applied to coat the hard coating film according to the present embodiment. In the arc ion plating method, it is preferable to use a film forming apparatus in which a cathode including permanent magnets disposed on the back surface and outer periphery of a target is mounted.

The film forming apparatus includes, for example, a cathode that applies an arc current to a target that is a material of a hard coating film, a furnace (vacuum vessel) that accommodates a substrate, a substrate rotating mechanism that rotates the substrate in the furnace, and a bias power supply that applies a bias voltage to the substrate. In addition, the film forming apparatus preferably includes a filter mechanism capable of reducing droplets by a magnetic field.

A temperature in the furnace during coating of the hard coating film according to the present embodiment is preferably 420° C. to 550° C. A pressure in the furnace is preferably 1 Pa to 6 Pa.

The absolute value of the bias voltage of a negative pressure applied to the substrate is preferably gradually increased from the vicinity of the substrate toward the vicinity of the surface of the hard coating film to be formed. In the vicinity of the substrate of the hard coating film, the bias voltage of the negative pressure applied to the substrate is preferably −40 V to −80 V. In the vicinity of the surface of the hard coating film, the bias voltage of the negative pressure applied to the substrate is preferably −100 V to −150 V.

The arc current applied to the target is also preferably gradually increased from the vicinity of the substrate to the vicinity of the surface of the hard coating film to be formed. In the vicinity of the substrate of the hard coating film, the arc current supplied to the target is preferably 70 A to 120 A. In the vicinity of the surface of the hard coating film, the arc current supplied to the target is preferably 120 A to 180 A.

The present description discloses various modes of techniques as described above, of which the main techniques are summarized below.

A coated member according to an embodiment of the present invention is a coated member comprising: a substrate and a hard coating film formed on a surface of the substrate, wherein the hard coating film contains a nitride or carbonitride of a metal element;

a content of aluminum (Al) is 65 atom % or more and 85 atom % or less, a content of chromium (Cr) is 15 atom % or more and 35 atom % or less, and a total content of aluminum (Al) and chromium (Cr) is 90 atom % or more and 100 atom % or less in a total amount of the metal element and metalloid element contained in the hard coating film;

in the hard coating film, in an intensity profile obtained from a selected area diffraction pattern of a transmission electron microscope, a crystal plane exhibiting a maximum peak intensity is different between a vicinity of the substrate and a vicinity of the surface;

in the vicinity of the substrate, a peak corresponding to a (111) plane or a (200) plane of a face-centered cubic lattice structure exhibits a maximum intensity; and in the vicinity of the surface, a peak corresponding to a crystal plane of the face-centered cubic lattice structure exhibits a maximum intensity and a peak intensity corresponding to a (220) plane of the face-centered cubic lattice structure is 0.6 times or more a larger one of the peak intensity corresponding to the (200) plane and the peak intensity corresponding to the (111) plane of the face-centered cubic lattice structure.

According to this configuration, the coated member having excellent durability can be obtained.

In the coated member in the above embodiment, in the intensity profile in the vicinity of the surface of the hard coating film obtained from the selected area diffraction pattern of the transmission electron microscope, it is preferable that when a maximum peak intensity corresponding to AlN having a hexagonal close-packed structure is denoted by Ih, and a sum of the peak intensities corresponding to the (111) plane, the (200) plane, and the (220) plane of the face-centered cubic lattice structure is denoted by If, a relationship of Ih×100/(Ih+If)≤20 is satisfied.

According to this configuration, the coated member having more excellent durability can be obtained.

EXAMPLES

<Sample>

A coated member comprising a hard coating film formed on a surface of a substrate was used as a sample.

<Substrate>

As the substrate, a two-bladed ball end mill made of cemented carbide was used. The composition of the substrate was Co: 8% by mass, Cr: 0.5% by mass, and VC: 0.3% by mass, with the balance being WC and unavoidable impurities. The average WC grain size was 0.6 μm and the hardness of the substrate was 93.9 HRA.

<Method for Manufacturing Sample>

<Film Forming Apparatus>

A film forming apparatus using an arc ion plating system was used for forming (film-forming) a hard coating film on the surface of the substrate. The film forming apparatus included a plurality of cathodes (arc evaporation sources), a vacuum vessel, and a substrate rotating mechanism. The cathode included an electromagnetic coil for converging plasma on the front surface of a target, and a permanent magnet on the back surface of the target. The cathode included a filter mechanism capable of reducing droplets by a magnetic field. The inside of a vacuum container could be evacuated by a vacuum pump, and gas could be introduced into the vacuum container from a supply port provided in the vacuum container. A bias power supply could be connected to the substrate set in the vacuum container, and a negative bias voltage could be independently applied to the plurality of substrates. The substrate rotating mechanism included a work table, a plate-shaped jig mounted on the work table, and a pipe-shaped jig mounted on the plate-shaped jig. In the substrate rotating mechanism, the work table was rotated at a speed of 3 rotations per minute. The plate-shaped jig and the pipe-shaped jig were rotatable and revolvable.

<Heating and Vacuum-Exhausting Step>

Each of the plurality of substrates was fixed to the pipe-shaped jig in the vacuum container of the film forming apparatus, and a pre-film forming process was performed as follows. First, the inside of the vacuum container was evacuated to $5\times10^{-3}$ Pa or less. Thereafter, heating was performed with a heater set in the vacuum container until the temperature of the substrate reached 500° C., and evacuation was performed. As a result, the temperature of the substrate was set to 500° C., and a pressure in the vacuum container was set to $5\times10^{-3}$ Pa or less.

<Ar Bombardment Step>

Thereafter, Ar gas was introduced into the vacuum container, a current was caused to flow through a filament to generate Ar ions, a negative bias voltage was applied to the substrate, and Ar bombardment was performed.

<Film Forming Step>

After the Ar bombardment, the gas in the vacuum vessel was replaced with nitrogen, and the pressure in the vacuum vessel was set to 4 Pa. Power was supplied to the cathode and a negative bias voltage was applied to coat the substrate with about 3 μm of a nitride (hard coating film). Film forming conditions are summarized in Table 1. In the column of "Cathode" in Table 1, for example, "Al75Cr25" means that the composition of the cathode is Al: 75 atom % and Cr: 25 atom %. In the columns of Bias Voltage and Arc Current, when the values of the bias voltage and the arc current are changed (inclined) from the vicinity of the substrate to the vicinity of the surface of the hard coating film, values in the vicinity of the substrate, the vicinity of the surface, and an intermediate position thereof are described. When the values of the bias voltage and the arc current were kept constant without being changed, the values were described.

TABLE 1

| | Cathode (atom %) | Bias Voltage (−V) | Arc Current (A) |
|---|---|---|---|
| Example 1 | Al75Cr25 | Vicinity of substrate: 70<br>Intermediate: 70 to 130<br>Vicinity of surface: 130 | Vicinity of substrate: 100<br>Intermediate: 100 to 150<br>Vicinity of surface: 150 |
| Example 2 | Al75Cr25 | Vicinity of substrate: 70<br>Intermediate: 70 to 150<br>Vicinity of surface: 150 | Vicinity of substrate: 100<br>Intermediate: 100 to 150<br>Vicinity of surface: 150 |
| Example 3 | Al80Cr20 | Vicinity of substrate: 90<br>Intermediate: 90 to 150<br>Vicinity of surface: 150 | Vicinity of substrate: 100<br>Intermediate: 100 to 150<br>Vicinity of surface: 150 |
| Example 4 | Al80Cr20 | Vicinity of substrate: 50<br>Intermediate: 50 to 150<br>Vicinity of surface: 150 | Vicinity of substrate: 100<br>Intermediate: 100 to 150<br>Vicinity of surface: 150 |
| Comparative Example 1 | Al80Cr20 | 150 | Vicinity of substrate: 100<br>Intermediate: 100 to 150<br>Vicinity of surface: 150 |
| Comparative Example 2 | Al80Cr20 | 100 | 150 |
| Comparative Example 3 | Al80Cr20 | 70 | 150 |
| Comparative Example 4 | Al80Cr20 | 40 | 150 |
| Comparative Example 5 | Al70Cr30 | 150 | 150 |
| Comparative Example 6 | Al70Cr30 | 40 | 150 |
| Comparative Example 7 | Al60Cr40 | 150 | 150 |

<<Composition Analysis>>

The composition of the hard coating film was measured using wavelength dispersive electron probe microanalysis (WDS-EPMA) attached to an electron probe microanalyzer (JXA-8500F manufactured by JEOL Ltd.). The cross section of a ball end mill comprising a hard coating film formed on a surface thereof was mirror-finished and used for composition analysis. Measurement conditions included an acceleration voltage of 10 kV, an irradiation current of $5\times10^{-8}$ A, and an uptake time of 10 seconds. An analysis region was the range of a diameter of about 1 μm per point, and the content of each element was measured for five points. The content ratio of the detected element and the metal element content ratio of the hard coating film were determined from the average of the measured values at five points.

<<TEM Analysis>>

The hard coating film was subjected to micro analysis using a field emission transmission electron microscope (TEM, JEM-2100F manufactured by JEOL Ltd.). Specifically, the selected area diffraction pattern of the hard coating film was obtained, and the structure was observed as described later. The selected area diffraction pattern of the hard coating film was obtained under the conditions of an acceleration voltage of 200 kV, a selected area region diameter φ of 500 nm (circular shape), a camera length of 100 cm, and an incident electron amount of 5.0 pA/cm$^2$ (on a fluorescent plate). The selected area diffraction pattern was determined for the vicinity of the substrate and the vicinity of the surface of the hard coating film. The brightness of the obtained selected area diffraction pattern was converted into an intensity to obtain an intensity profile according to the above-described method. From the intensity profile, the peak intensity of each crystal plane of the hard coating film and the value of Ih×100/(If+Ih) in the vicinity of the surface were determined.

<<Residual Stress>>

The residual stress and crystal structure of the hard coating film were measured by a sin$^2$ψ method using an X-ray diffractometer. For the measurement of the residual stress, a test piece made of cemented carbide was used.

<<Hardness/Elastic Modulus>>

The hardness and elastic modulus of the hard coating film were measured using a nanoindentation tester (ENT-2100 manufactured by Elionix Inc.). The measurement was performed by mirror-polishing the cross section of the coating film obtained by inclining the test piece by 5 degrees with respect to the outermost surface of the coating film, and then selecting a region where a maximum indentation depth was less than about 1/10 of the film thickness in the polished surface of the coating film. 15 points were measured under the measurement condition of an indentation load of 9.8 mN/sec. The hardness and elastic modulus of the hard coating film were obtained from the average value of 11 points excluding 2 points on the large value side and 2 points on the small value side among the 15 points measured.

The measured values are summarized in Tables 2 and 3. The measurement is not performed in the blank column or "–" column of each Table. For example, "Al70Cr30N" described in the column of "Coating Film Composition" in Table 2 means that the hard coating film is made of a nitride of an alloy of Al and Cr, and the composition of the metal component of the hard coating film is Al: 70 atom % and Cr: 30 atom %. A numerical value described in the column of "Vicinity of Surface (220) Surface Intensity Ratio" is a "value obtained by dividing the peak intensity corresponding to the (220) plane of the face-centered cubic lattice structure in the vicinity of the surface of the hard coating film by the larger one of the peak intensity corresponding to the (200) plane and the peak intensity corresponding to the (111) plane of the face-centered cubic lattice structure" ("peak magnification").

TABLE 2

| Sample No. | Coating Film Composition (atom %) | Vicinity of Substrate Maximum Intensity Surface | Vicinity of Surface Maximum Intensity Surface | Vicinity of Surface (220) Surface Intensity Ratio | Vicinity of Surface Ih × 100/(Ih + If) |
|---|---|---|---|---|---|
| Example 1 | Al70Cr30N | fcc (200) | fcc (220) | 1.3 | 2 |
| Example 2 | Al70Cr30N | fcc (200) | fcc (220) | 2.2 | 2 |
| Example 3 | Al80Cr20N | fcc (200) | fcc (111) | 0.8 | 19 |
| Example 4 | Al80Cr20N | fcc (111) | fcc (220) | 1.3 | 10 |
| Comparative Example 1 | Al80Cr20N | fcc (111) | | — | — |
| Comparative Example 2 | Al80Cr20N | fcc (200) | | — | — |
| Comparative Example 3 | Al80Cr20N | fcc (200) | | — | — |
| Comparative Example 4 | Al80Cr20N | hcp structural main body | | — | — |
| Comparative Example 5 | Al65Cr35N | fcc (220) | | — | — |
| Comparative Example 6 | Al70Cr30N | fcc (200) | | — | — |
| Comparative Example 7 | Al56Cr44N | fcc (200) | | — | — |

TABLE 3

| Sample No. | Residual Stress (GPa) | Hardness (GPa) | Elastic Modulus (GPa) |
|---|---|---|---|
| Example 1 | −9.3 | | |
| Example 2 | −7.8 | | |
| Example 3 | −4.8 | 27 | 462 |
| Example 4 | −4.9 | | |
| Comparative Example 1 | −8.2 | | |
| Comparative Example 2 | −2.3 | | |
| Comparative Example 3 | −1.7 | | |
| Comparative Example 4 | −0.2 | 16 | 332 |
| Comparative Example 5 | −6.0 | 40 | 629 |
| Comparative Example 6 | −0.7 | 32 | 378 |
| Comparative Example 7 | −2.0 | 33 | 486 |

For Examples 1 to 4 coated while a bias voltage of a negative pressure applied to the substrate was inclined (changed) from the vicinity of the substrate to the vicinity of the surface, the intensity profiles were obtained from the selected area diffraction patterns in the vicinity of the substrate and the vicinity of the surface, and the crystal structure was evaluated.

In Comparative Examples, the bias voltage applied to the substrate during coating was constant, and the crystal planes exhibiting the maximum intensity in the vicinity of the substrate and the vicinity of the surface were the same. Comparative Example 7 is AlCr nitride conventionally generally used in cutting tools.

In the measurement of the crystal structure using an X-ray diffractometer, no clear peak corresponding to AlN having a hexagonal close-packed (hcp) structure was confirmed except for Comparative Example 4.

Figure 2:
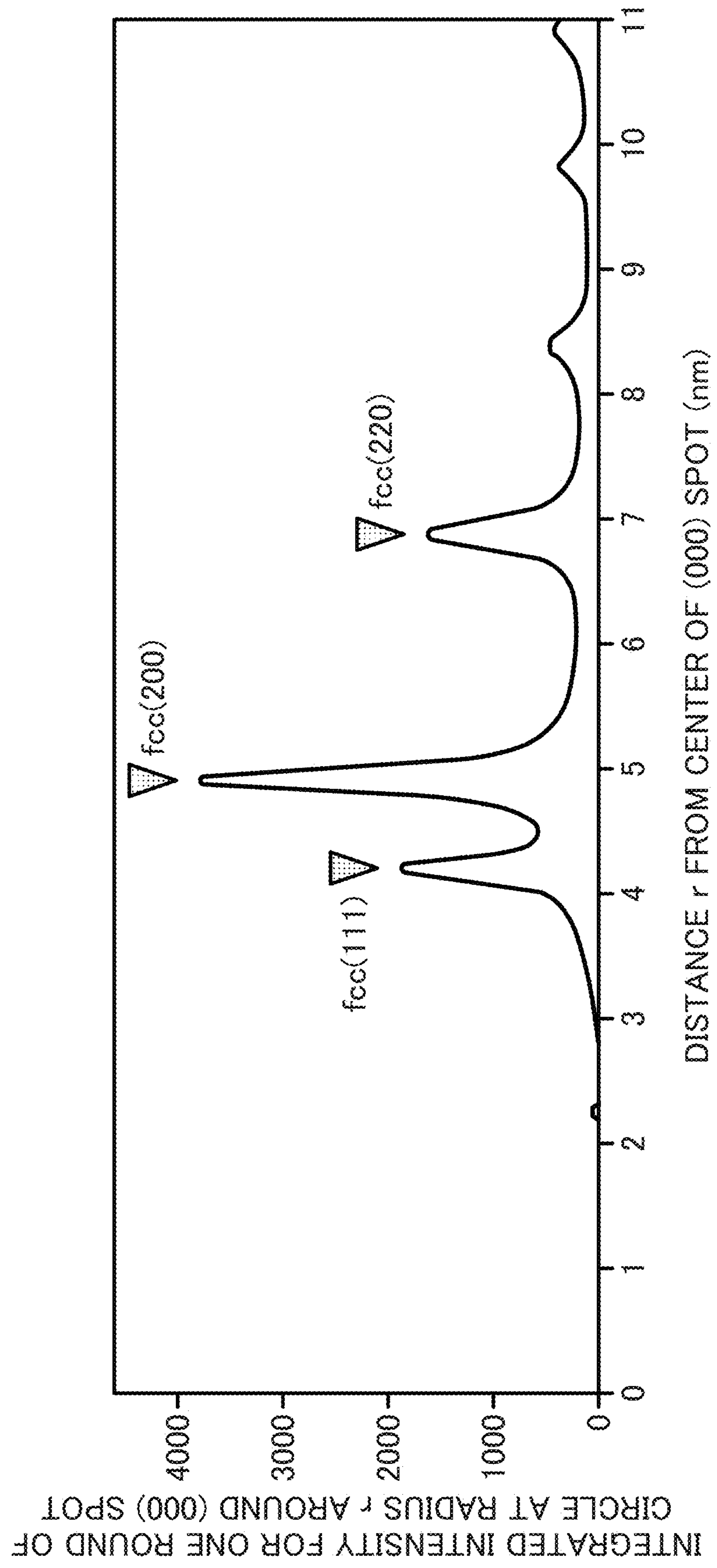
FIG. 2 is a diagram illustrating an example of an intensity profile obtained from the selected area diffraction pattern of FIG. 1.
Figure 3:
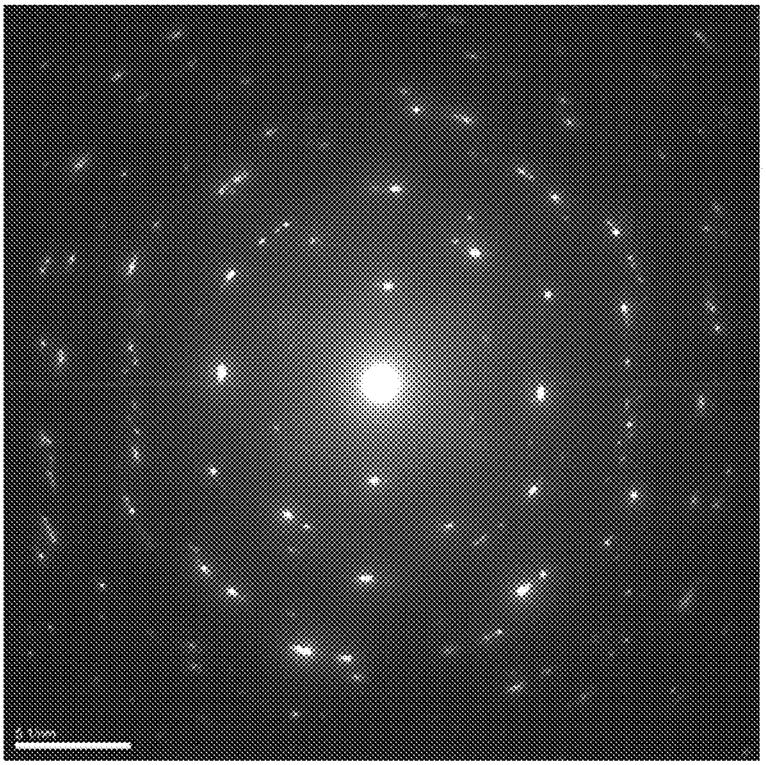
FIG. 3 is a diagram illustrating an example of a selected area diffraction pattern in the vicinity of a surface of a hard coating film according to Example 1.
Figure 4:
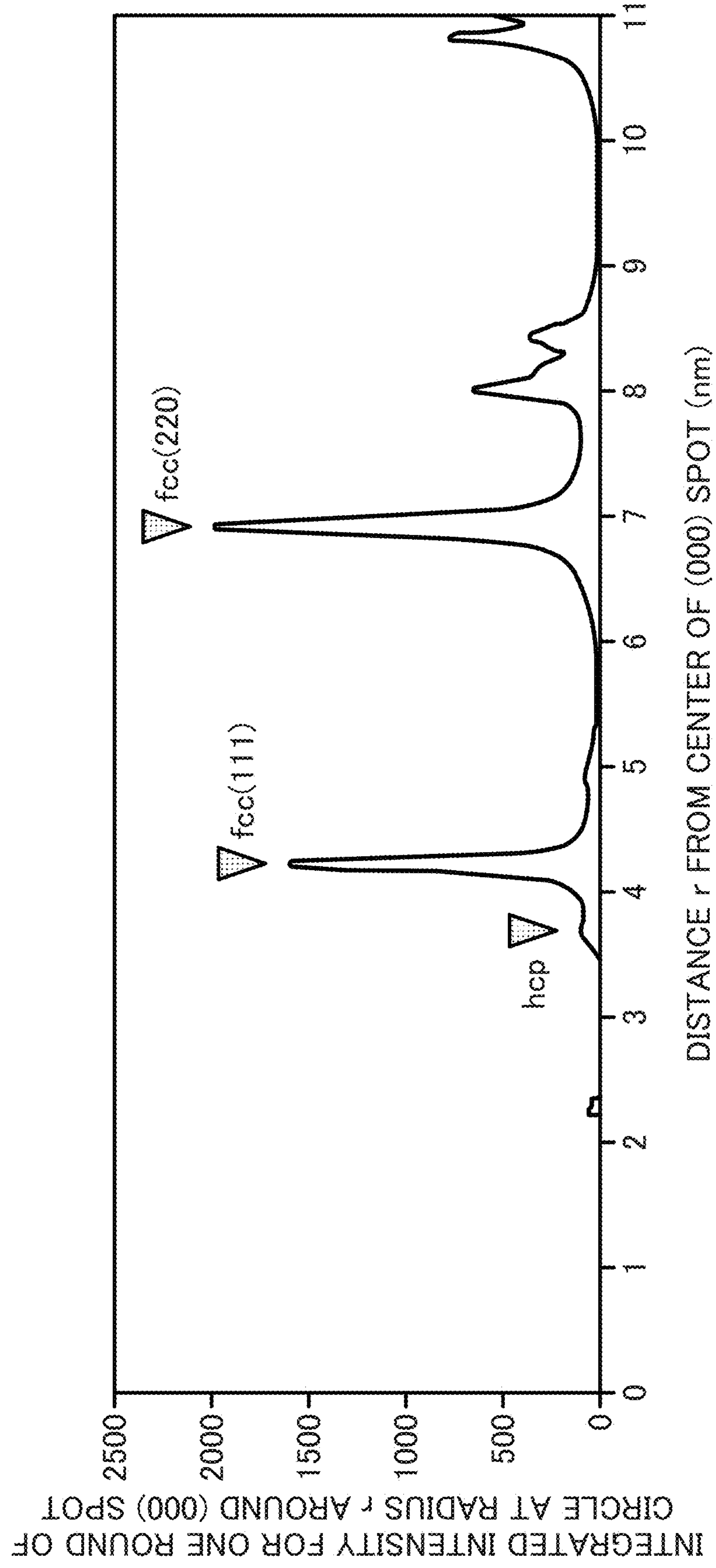
FIG. 4 is a diagram illustrating an example of an intensity profile obtained from the selected area diffraction pattern of FIG. 3.

FIGS. 1 to 4 illustrate TEM analysis results of Example 1. FIG. 1 illustrates a selected area diffraction pattern in the vicinity of a substrate of a hard coating film according to Example 1. FIG. 2 illustrates an intensity profile obtained from the selected area diffraction pattern of FIG. 1. FIG. 3 illustrates a selected area diffraction pattern in the vicinity of a surface of a hard coating film according to Example 1. FIG. 4 illustrates an intensity profile obtained from the selected area diffraction pattern of FIG. 3. In the peaks of the hard coating film according to Example 1, the peak corresponding to the (200) plane of the face-centered cubic lattice (fcc) structure exhibited the maximum intensity in the vicinity of the substrate. In the vicinity of the surface, the peak corresponding to the (220) plane of the face-centered cubic lattice structure exhibited the maximum intensity. The peak corresponding to AlN having a hexagonal close-packed (hcp) structure was slightly confirmed in the vicinity of the surface.

Figure 5:
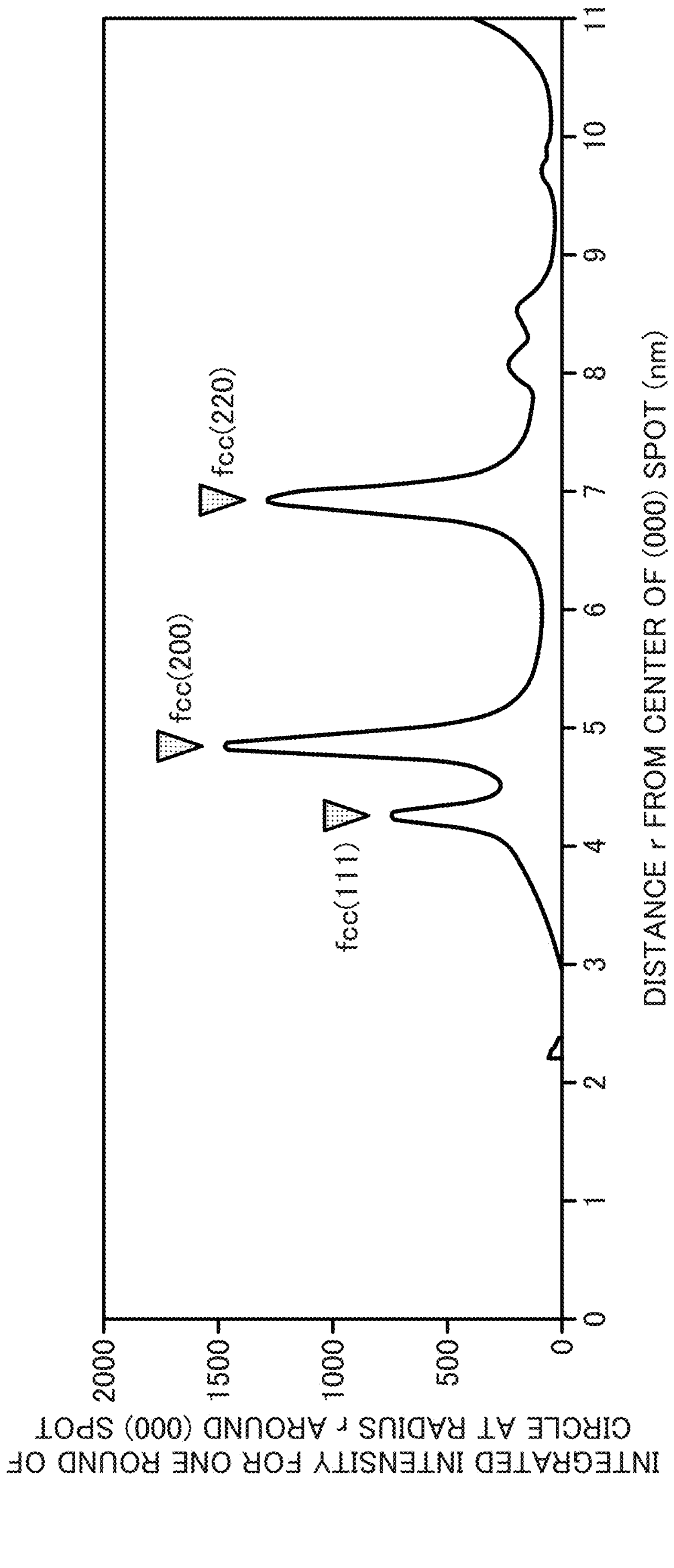
FIG. 5 is a diagram illustrating an example of an intensity profile obtained from a selected area diffraction pattern in the vicinity of a substrate of a hard coating film according to Example 2.
Figure 6:
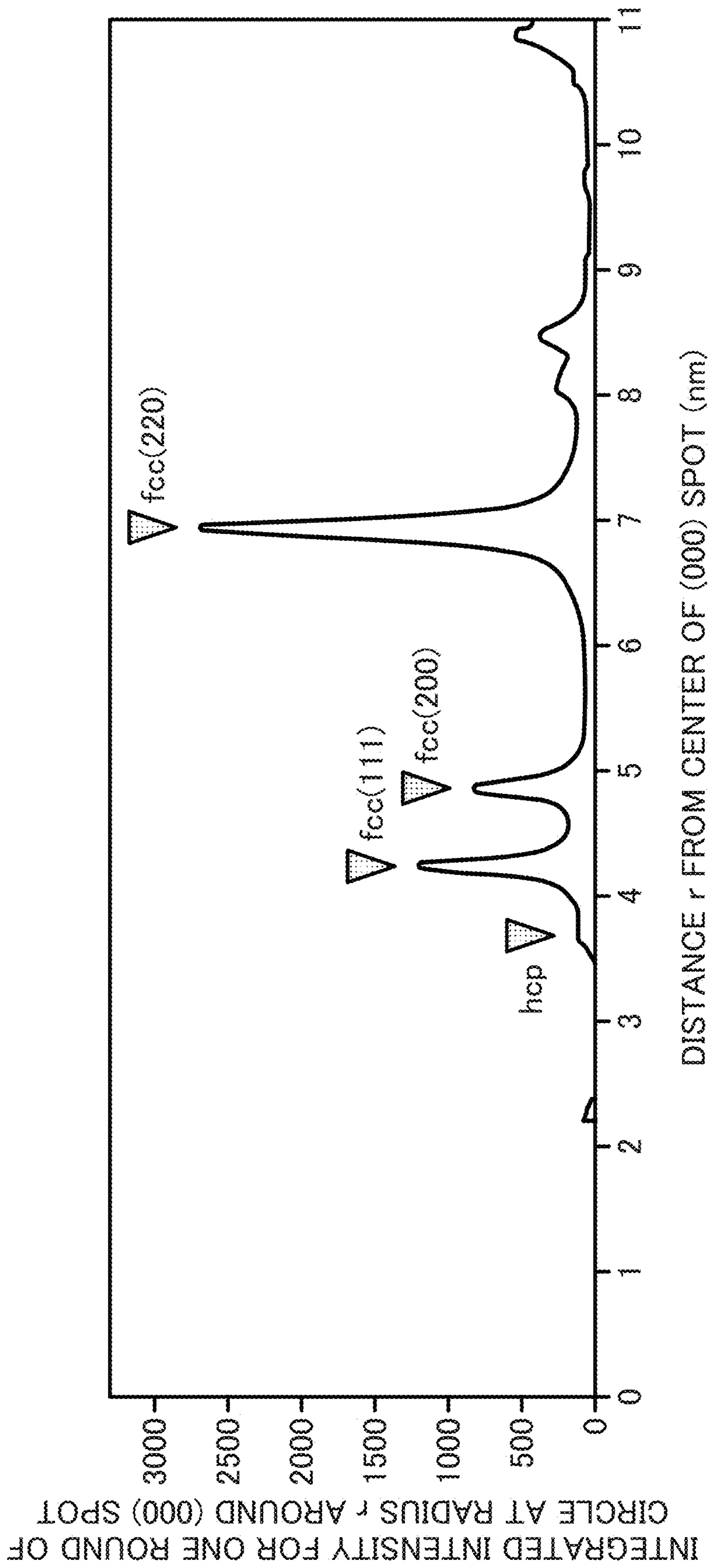
FIG. 6 is a diagram illustrating an example of an intensity profile obtained from a selected area diffraction pattern in the vicinity of a surface of the hard coating film according to Example 2.

FIGS. 5 and 6 illustrate intensity profiles in the vicinity of the substrate and in the vicinity of the surface obtained from the selected area diffraction pattern of the hard coating film according to Example 2. In the peaks of the hard coating film according to Example 2, the peak corresponding to the (200) plane of the face-centered cubic lattice structure exhibited the maximum intensity in the vicinity of the substrate. In the vicinity of the surface, the peak corresponding to the (220) plane of the face-centered cubic lattice structure exhibited the maximum intensity. Also in the hard coating film according to Example 2, the peak corresponding to AlN having a hexagonal close-packed (hcp) structure was slightly confirmed in the vicinity of the surface.

Figure 7:
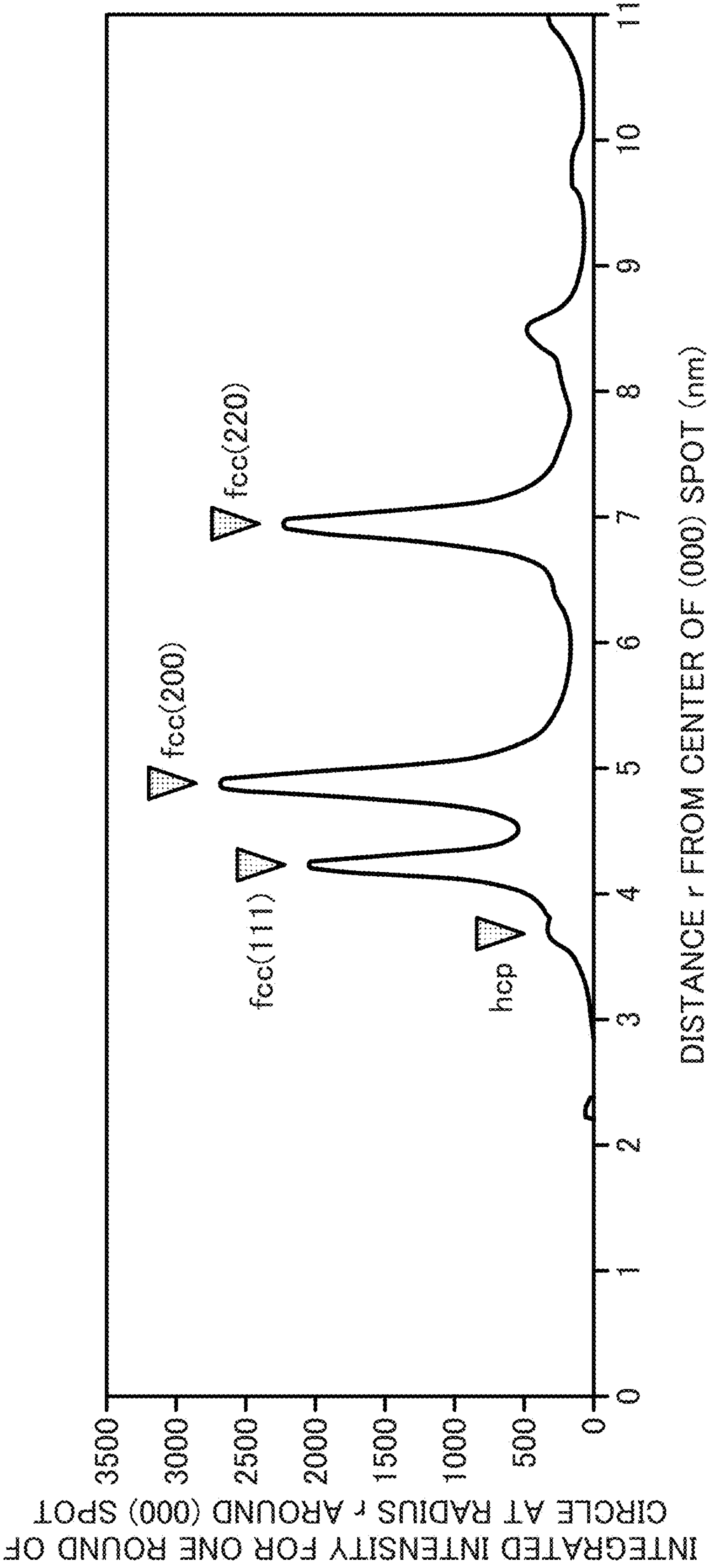
FIG. 7 is a diagram illustrating an example of an intensity profile obtained from a selected area diffraction pattern in the vicinity of a substrate of a hard coating film according to Example 3.
Figure 8:
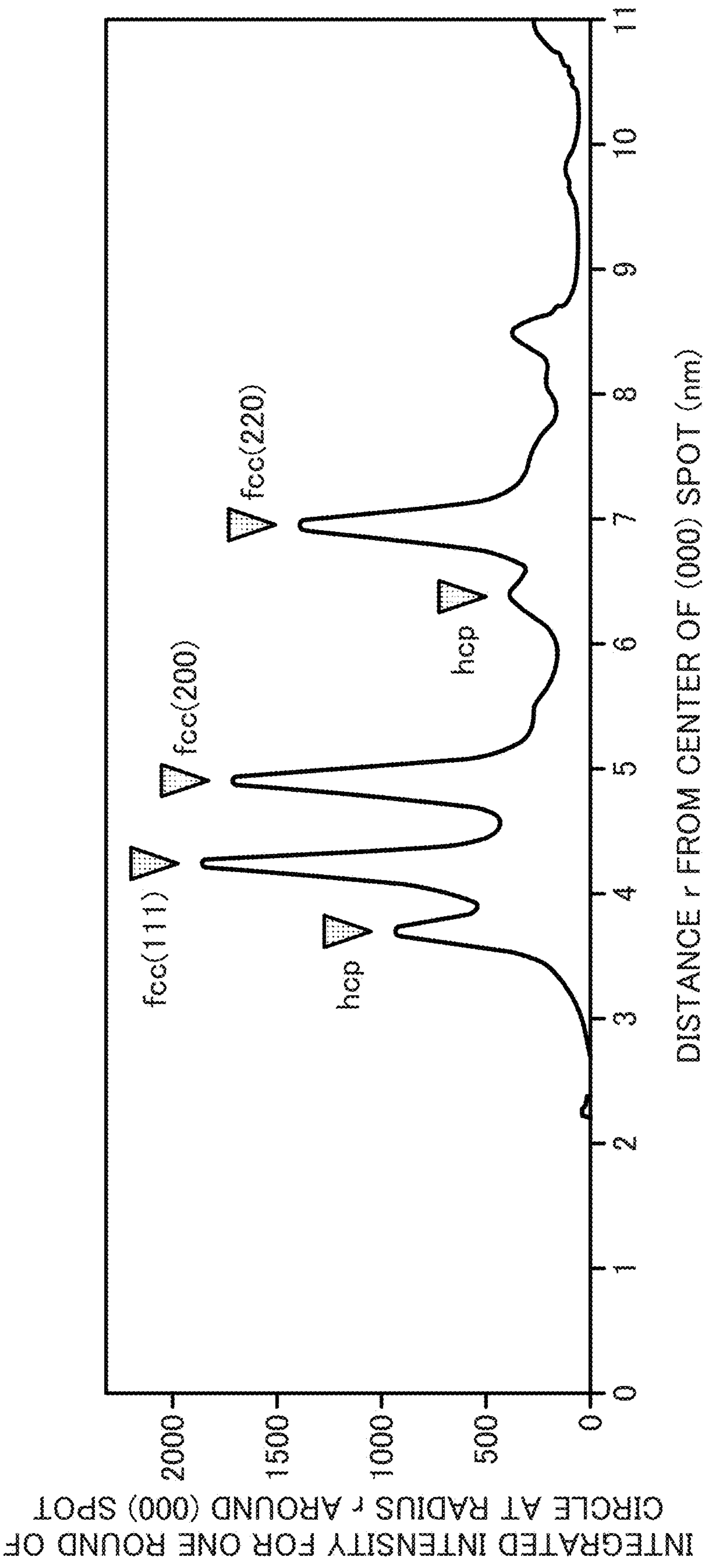
FIG. 8 is a diagram illustrating an example of an intensity profile obtained from a selected area diffraction pattern in the vicinity of a surface of the hard coating film according to Example 3.

FIGS. 7 and 8 illustrate intensity profiles in the vicinity of the substrate and in the vicinity of the surface obtained from the selected area diffraction pattern of the hard coating film according to Example 3. In the peaks of the hard coating film according to Example 3, the peak corresponding to the (200) plane of the face-centered cubic lattice structure exhibited the maximum intensity in the vicinity of the substrate. In the vicinity of the surface, the peak corresponding to the (111) plane of the face-centered cubic lattice structure exhibited the maximum intensity. In the vicinity of the surface of the hard coating film according to Example 3, more peaks corresponding to AlN having a hexagonal close-packed (hcp) structure than those in Examples 1 and 2 were confirmed.

Figure 9:
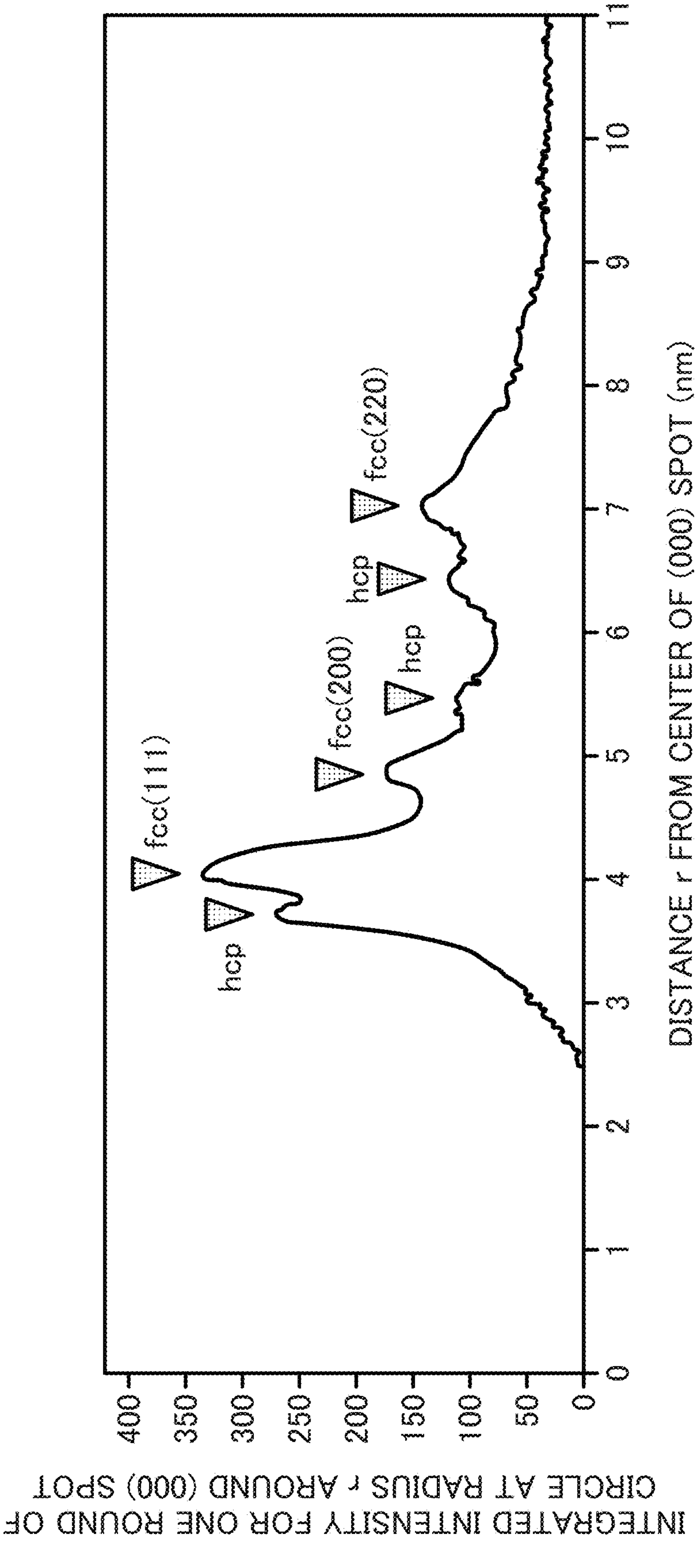
FIG. 9 is a diagram illustrating an example of an intensity profile obtained from a selected area diffraction pattern in the vicinity of a substrate of a hard coating film according to Example 4.
Figure 10:
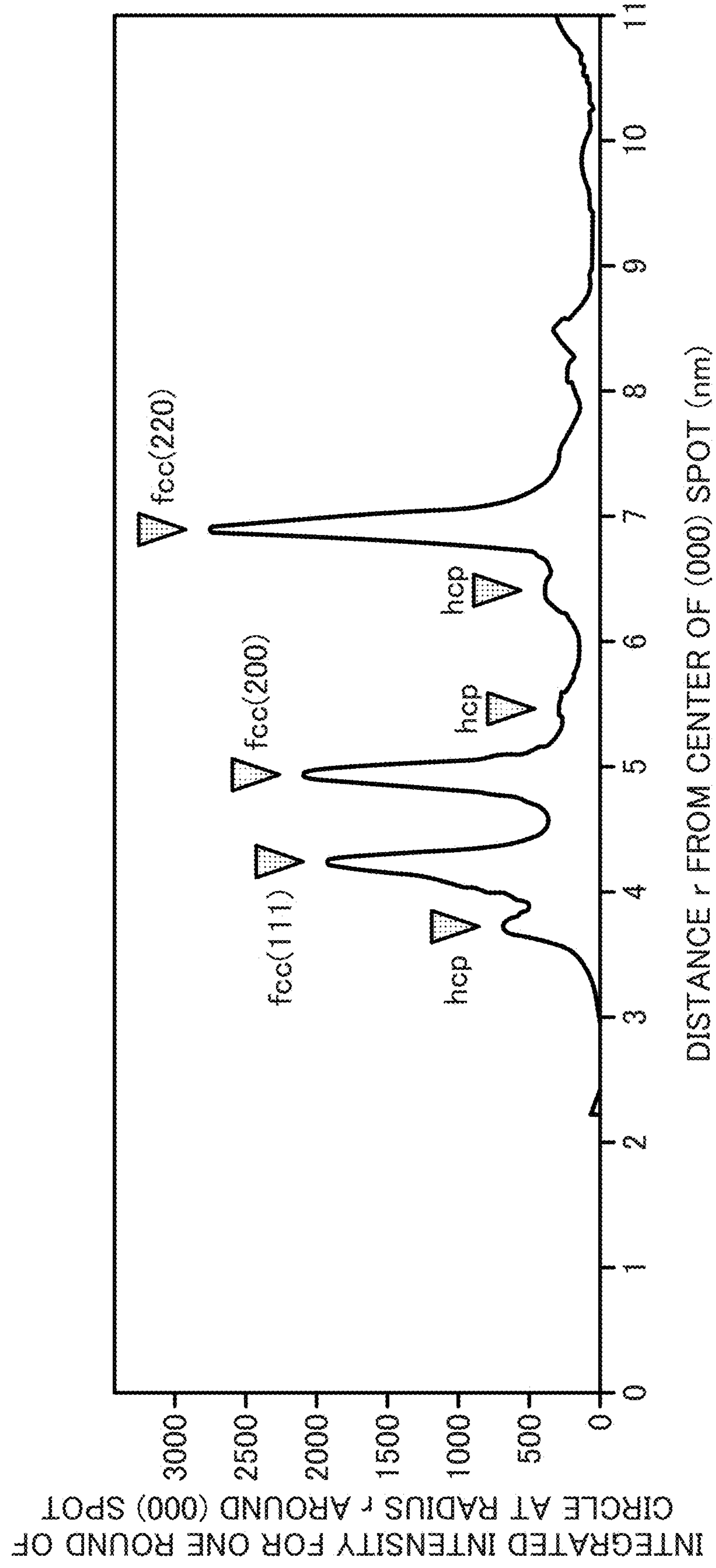
FIG. 10 is a diagram illustrating an example of an intensity profile obtained from a selected area diffraction pattern in the vicinity of a surface of the hard coating film according to Example 4.

FIGS. 9 and 10 illustrate intensity profiles obtained from the selected area diffraction pattern of the hard coating film according to Example 4. In Example 4, a peak corresponding to the (111) plane of the face-centered cubic lattice structure exhibited the maximum intensity in the vicinity of the substrate. In the vicinity of the surface, the peak corresponding to the (220) plane of the face-centered cubic lattice structure exhibited the maximum intensity. In the vicinity of the substrate and in the vicinity of the surface of Example 4, more peaks corresponding to AlN having a hexagonal close-packed (hcp) structure than those in Examples 1 and 2 were confirmed.

In the hard coating films according to Examples 1 to 4, it was confirmed that the crystal planes exhibiting the maximum peak intensity were different between the vicinity of the substrate and the vicinity of the surface, and the peak corresponding to the (220) plane was high in the vicinity of the surface (the surface vicinity (220) plane intensity ratio (peak magnification) was 0.6 or more).

In order to confirm the microstructures of the hard coating films according to Examples 1 to 4, the structure observations of the vicinity of the substrate and the vicinity of the surface were performed. In a cross-sectional structure observed from a direction perpendicular to a film thickness growth direction, a crystal grain boundary tends to be unclear due to the influence of the overlap in the thickness direction of the sample. Therefore, in order to evaluate the crystal grain size by removing the influence of the overlap in the thickness direction of the sample, the structure observation was performed from the film thickness growth direction.

A transmission electron microscope was used for the structure observation. First, the structure observation was performed at a low magnification, and portions excluding portions where apparently coarse crystal particles were present were selected. The selected portion was observed at a magnification at which 100 or more crystal particles were obtained, and evaluated.

Figure 11:
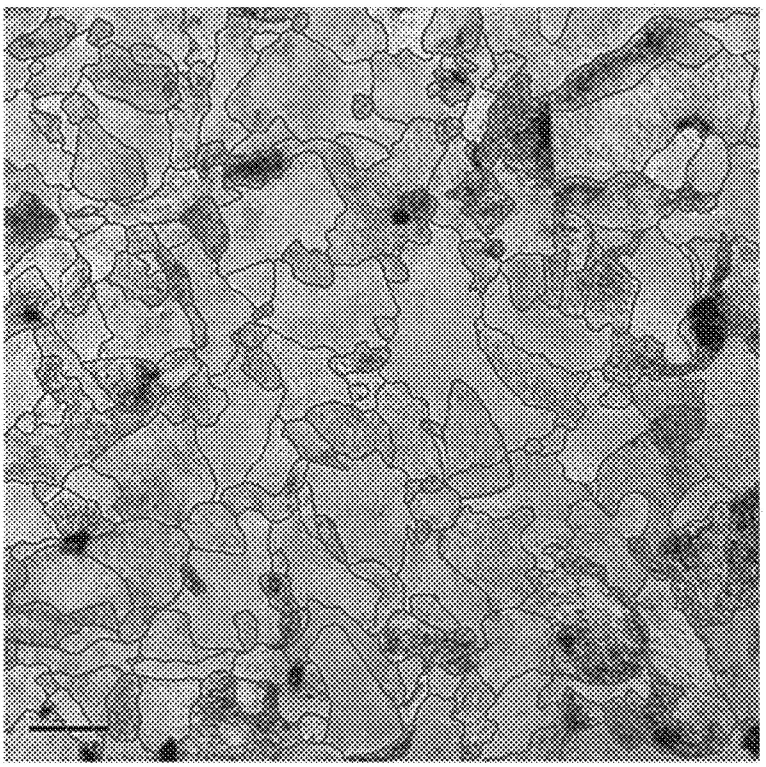
FIG. 11 is an example of a structural photograph (×180,000 times) observed from a film thickness growth direction in the vicinity of the substrate of the hard coating film according to Example 1.
Figure 12:
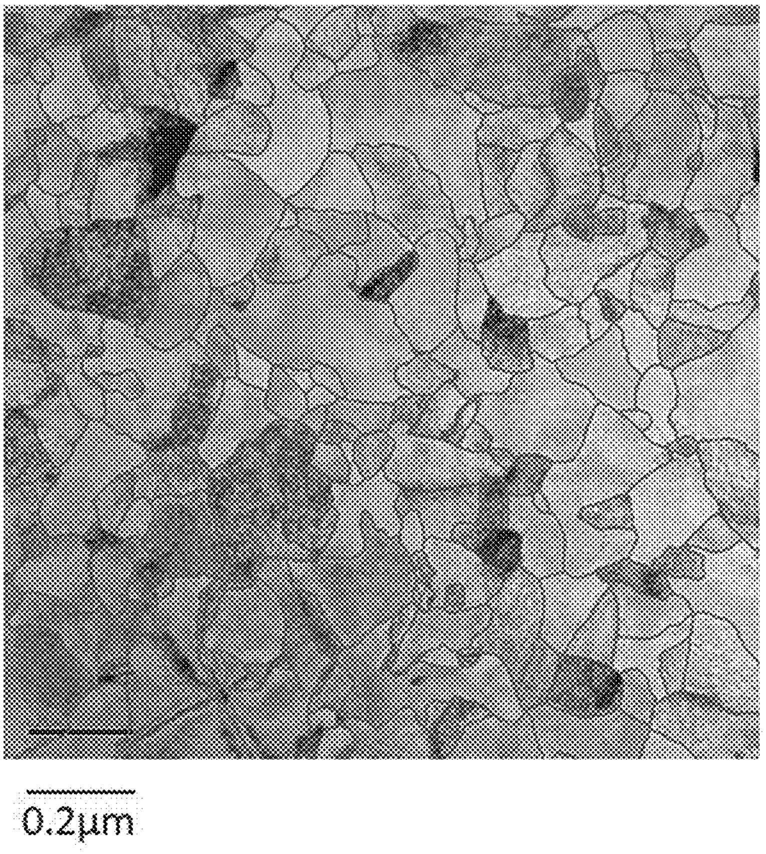
FIG. 12 is an example of a structural photograph (×120,000 times) observed from the film thickness growth direction in the vicinity of the surface of the hard coating film according to Example 1.

FIGS. 11 and 12 are examples of structure observation photographs of the vicinity of the substrate and the vicinity of the surface of the hard coating film according to Example 1. A binarized image was produced from the observation photographs of FIGS. 11 and 12, and the area of each granular particle was determined. From the obtained area, a circle equivalent grain size was calculated, and a crystal grain size was evaluated. The circle equivalent particle size is a diameter of a perfect circle having the same area as the area of a columnar particle. Crystal particles discontinuous around the image were excluded from observation. In the vicinity of the substrate, the circular equivalent average crystal grain size was 59 nm, and the standard deviation was 35 nm. In the vicinity of the surface, the circle equivalent average crystal grain size was 90 nm, and the standard deviation was 52 nm. In the hard coating films according to Examples 1 to 4, the crystal grain size and the standard deviation were larger in the vicinity of the surface than in the vicinity of the substrate. Meanwhile, the crystal grain size was substantially uniform over the entire hard coating films according to Comparative Examples 1 to 7.

<Cutting Test>

(Condition) Dry processing

Tool: Two-blade cemented carbide ball end mill (ball radius 1.0 mm)

Cutting method: Bottom surface cutting

Work Material: STAVAX (52HRC) (manufactured by Bohler-Uddeholm Co., Ltd.)

Notch: 0.14 mm in axial direction and 0.14 mm in radial direction

Cutting speed: 99.0 m/min

Single blade feed amount: 0.028 mm/blade

Cutting distance: 40 m

Evaluation method: After cutting, a maximum flank wear width near the chisel of the ball end mill was measured using a scanning electron microscope.

The cutting evaluation results are summarized in Table 4.

TABLE 4

| Sample No. | Maximum Flank Wear Width (μm) |
|---|---|
| Example 1 | 19 |
| Example 2 | 37 |
| Example 3 | 22 |
| Example 4 | 22 |
| Comparative Example 1 | Early peeling |
| Comparative Example 2 | Early peeling |
| Comparative Example 3 | Early peeling |
| Comparative Example 4 | Early peeling |
| Comparative Example 5 | 50 |
| Comparative Example 6 | Early peeling |
| Comparative Example 7 | 47 |

The hard coating films according to Examples 1 to 4 had a smaller maximum flank wear width and more excellent durability than those of Comparative Example 7.

The hard coating films according to Comparative Examples 1 to 4 and 6 tended to be poor in durability due to early coating film peeling. The reason for this is assumed to be poor adhesion of the hard coating film. The hard coating films according to Comparative Examples 5 and 7 had a larger maximum flank wear width and poorer durability than those of Examples 1 to 4.

This application is based on Japanese Patent Application No. 2022-045832 filed on Mar. 22, 2022, the contents of which are incorporated herein.

It should be understood that the embodiments and examples disclosed herein are exemplary in all respects and do not pose any limitation. The scope of the present invention is indicated by the scope of claims instead of the above description, and is intended to include meanings equivalent to the scope of claims and all modifications within the scope.

INDUSTRIAL APPLICABILITY

The embodiment of the present invention provides a coated member including a coating film containing Al-rich AlCr nitride and being excellent in durability. The coated member can be suitably applied to a mold or a cutting tool or the like.

The invention claimed is:

1. A coated member comprising: a substrate and a hard coating film formed on a surface of the substrate, wherein the hard coating film contains a nitride or carbonitride of a metal element;

a content of aluminum (Al) is 65 atom % or more and 85 atom % or less, a content of chromium (Cr) is 15 atom % or more and 35 atom % or less, and a total content of aluminum (Al) and chromium (Cr) is 90 atom % or more and 100 atom % or less in a total amount of all metal elements and any metalloid elements contained in the hard coating film;

in the hard coating film, in an intensity profile obtained from a selected area diffraction pattern of a transmission electron microscope, a crystal plane exhibiting a maximum peak intensity is different between a vicinity of the substrate and a vicinity of a surface of the hard coating film;

in the vicinity of the substrate, a peak corresponding to a (111) plane or a (200) plane of a face-centered cubic lattice structure exhibits a maximum intensity; and in the vicinity of the surface, a peak corresponding to a crystal plane of the face-centered cubic lattice structure exhibits a maximum intensity and a peak intensity corresponding to a (220) plane of the face-centered cubic lattice structure is 0.6 times or more a larger one of a peak intensity corresponding to the (200) plane and a peak intensity corresponding to the (111) plane of the face-centered cubic lattice structure.

2. The coated member according to claim 1, wherein in the intensity profile in the vicinity of the surface of the hard coating film obtained from the selected area diffraction pattern of the transmission electron microscope, when a maximum peak intensity corresponding to AlN having a hexagonal close-packed structure is denoted by Ih, and a sum of the peak intensities corresponding to the (111) plane, the (200plane, and the (220) plane of the face-centered cubic lattice structure is denoted by If, a relationship of $Ih \times 100/(Ih+If) \leq 20$ is satisfied.

3. The coated member according to claim 1, wherein the content of aluminum (Al) is 68 atom % or more and 82 atom % or less, and the content of chromium (Cr) is 18 atom % or more and 32 atom % or less.

* * * * *